United States Patent
Jain (10) Patent No.: US 9,100,257 B2
(45) Date of Patent: Aug. 4, 2015

(54) SYSTEMS AND METHODS FOR COMPOSITE ADAPTIVE FILTERING

(71) Applicant: Marvell World Trade Ltd., St. Michael (BB)

(72) Inventor: Kapil Jain, Santa Clara, CA (US)

(73) Assignee: Marvell World Trade Ltd., St. Michael (BB)

( * ) Notice: Subject to any disclaimer, the term of this patent is extended or adjusted under 35 U.S.C. 154(b) by 7 days.

(21) Appl. No.: 13/749,092

(22) Filed: Jan. 24, 2013

(65) Prior Publication Data

US 2013/0188759 A1  Jul. 25, 2013

Related U.S. Application Data

(60) Provisional application No. 61/590,631, filed on Jan. 25, 2012.

(51) Int. Cl.
  *H03H 7/30* (2006.01)
  *H04L 27/26* (2006.01)
  *H03H 21/00* (2006.01)

(52) U.S. Cl.
  CPC ....... *H04L 27/2649* (2013.01); *H03H 21/0012* (2013.01); *H03H 2021/0078* (2013.01)

(58) Field of Classification Search
  CPC .................. H04N 19/00066; H04N 19/00896; H04N 19/0089; H04N 7/26058; H04N 7/26377; H04B 1/001; H04B 10/60; H04B 10/6971; H04B 17/0057; H04L 25/0212; H04L 5/0007

USPC .......... 375/232, 223, 226, 229, 233, 260, 346
  See application file for complete search history.

(56) References Cited

U.S. PATENT DOCUMENTS

| | | | | |
|---|---|---|---|---|
| 6,505,222 B1 * | 1/2003 | Davis et al. | .................... | 708/323 |
| 6,654,471 B1 * | 11/2003 | Varga | ............................ | 381/94.8 |
| 6,671,374 B1 * | 12/2003 | Nemri et al. | ............. | 379/406.08 |
| 6,771,709 B2 * | 8/2004 | Huang et al. | .................... | 375/296 |
| 2009/0221253 A1 * | 9/2009 | Yamamoto et al. | ........... | 455/273 |
| 2009/0296965 A1 * | 12/2009 | Kojima | .......................... | 381/312 |
| 2010/0223311 A1 * | 9/2010 | Sugiyama | ..................... | 708/322 |

FOREIGN PATENT DOCUMENTS

GB            22260068      *  3/1993  ............. H03H 21/00

OTHER PUBLICATIONS

A muller & Elmirghani "Combined projection and correlation least mean square algorithm for channel estimation with the uncoded and chaotic speech" , 2001 IEEE.*

* cited by examiner

*Primary Examiner* — Dhaval Patel (57) ABSTRACT

Systems and methods are provided for adaptively filtering a signal. A signal is received, and the received signal is filtered to generate an output signal. A difference signal is generated based on a difference between the output signal and a reference signal, and a correlation of the received signal and the different signal is evaluated. Then, a mode is selected between a first adaptive filtering mode and a second adaptive filtering mode based at least in part on the correlation, and the received signal is filtered using the selected adaptive filtering mode.

18 Claims, 6 Drawing Sheets

FIG. 6

SYSTEMS AND METHODS FOR COMPOSITE ADAPTIVE FILTERING

CROSS REFERENCE TO RELATED APPLICATIONS

This application claims the benefit under 35 U.S.C. §119(e) of U.S. Provisional Application No. 61/590,631, filed on Jan. 25, 2012, which is incorporated herein by reference in its entirety.

FIELD

The present disclosure relates generally to adaptive filtering systems and methods, and more particularly, to systems and methods for selecting a mode of operation for composite adaptive filtering.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted as prior art against the present disclosure. The present disclosure relates generally to adaptive filtering, and, more particularly, to selecting a mode of operation for composite adaptive filtering.

In an adaptive filtering system, coefficients of the filter are updated based on an error signal. The adaptive filter performs an optimization to adjust its transfer function so that the output of the adaptive filter resembles a desired signal. This involves providing a feedback signal to the adaptive filter so that the filter may appropriately adjust its coefficients. The feedback signal is usually an error signal, or a difference between the output signal and the desired signal. Known methods for adaptive filtering suffer from having slow convergence times, high residual error in the steady state, or poor resilience to perturbations in the steady state.

SUMMARY

In accordance with an embodiment of the disclosure, systems and methods are provided for adaptively filtering a signal. A signal is received, and the received signal is filtered to generate an output signal. A difference signal is generated based on a difference between the output signal and a reference signal, and a correlation of the received signal and the different signal is evaluated. Then, a mode is selected between a first adaptive filtering mode and a second adaptive filtering mode based at least in part on the correlation, and the received signal is filtered using the selected adaptive filtering mode.

Evaluating the correlation comprises computing a correlation coefficient between a portion of the received signal and a portion of the difference signal. The first adaptive filtering mode is selected when the correlation coefficient exceeds a threshold, and the second adaptive filtering mode is selected when the correlation coefficient is less than or equal to the threshold. The threshold is based on an absolute value of the difference signal in steady state.

The first adaptive filtering mode yields a first convergence rate, and the second adaptive filtering mode yields a second convergence rate slower than the first convergence rate.

The first adaptive filtering mode yields a first residual error in a steady state, and the second adaptive filtering mode yields a second residual error in the steady state lower than the first residual error.

The first adaptive filtering mode yields a first value for a smoothing parameter and the second adaptive filtering mode yields second value for the smoothing parameter smaller than the first value, such that first adaptive filtering mode is selected when there is a transient change in the received signal or in the reference signal.

The selecting comprises selecting an adaptive filtering mode on a continuum between the first adaptive filtering mode and the second adaptive filtering mode. Selecting the adaptive filtering mode on the continuum allows for convergence to an optimal point on a two-dimensional plane.

The first adaptive filtering mode is a normalized least mean squares operation, and the second adaptive filtering mode is a correlation least mean squares operation.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

To provide an overall understanding of the disclosure, certain illustrative embodiments will now be described, including a selection system for selecting an appropriate mode of operation in an adaptive filtering system. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope thereof.

Figure 1:
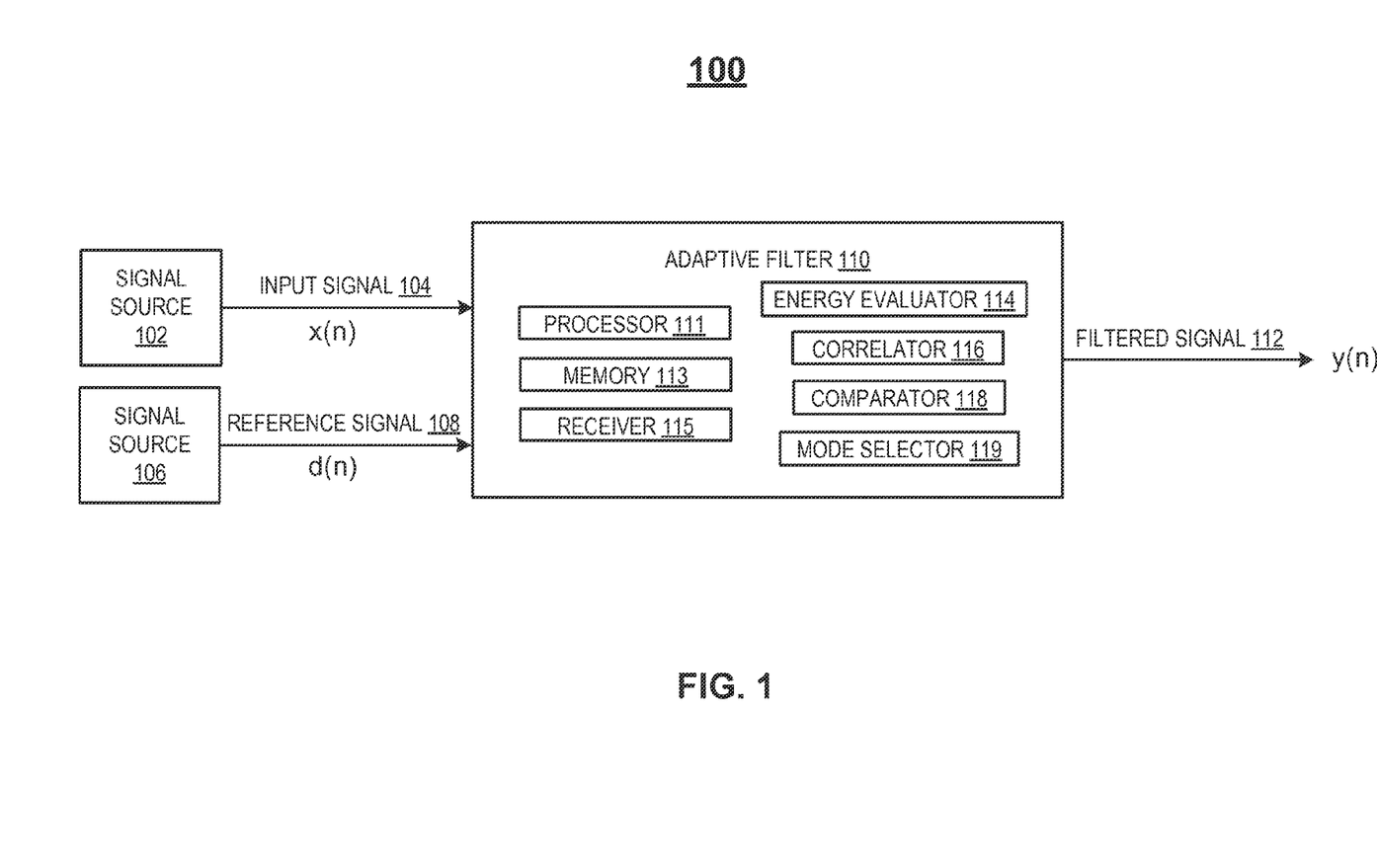
FIG. 1 shows an illustrative block diagram of an adaptive filtering system, in accordance with an embodiment of the disclosure.

FIG. 1 shows a simplified diagram of an illustrative composite adaptive filtering system 100, in accordance with an embodiment of the disclosure. System 100 includes two signal sources 102 and 106 and an adaptive filter 110, which includes a processor 111, a memory 113, a receiver 115, an energy evaluator 114, a correlator 116, a comparator 118, and a mode selector 119.

Signal source 102 provides an input signal 104 (i.e., x(n)) to adaptive filter 110, and signal source 106 provides a reference signal 108 (i.e., d(n)) to adaptive filter 110. Signal sources 102 and 106 may be related to each other. For example, it may be desirable to filter input signal 104 such that an output of adaptive filter 110, a filtered signal 112 (i.e., y(n)), resembles reference signal 108. In this case, reference signal 108 may be a desired signal, and adaptive filter 110 adjusts the filter coefficients such that filter signal 112 resembles the desired signal.

Signal sources 102 and 106 can be any type of signal source. The signals may be discretized versions of continuous signals. As an example, the signals may be vectors of discrete samples corresponding to acoustic signals representative of sound waves received by a microphone. Either or both of signal sources 102 and 106 may be configured to process the signals to get the signals into a desired form. For example, signal sources 102 and/or 106 may quantize the signal, filter the signal, or perform any number of processing techniques on the signal. In general, any signal source may be used, if it is desirable to adaptively filter the input signal using the reference signal.

In one implementation, the signals shown in FIG. 1 are acoustic signals, and input signal 104 includes echoes. For example, a room might contain a microphone and a loudspeaker, and sound waves picked up by the microphone are transmitted to the loudspeaker. An echo path is created between the loudspeaker and the microphone because the sound waves produced by the loudspeaker might then be picked up by the microphone. System 100 may be used to cancel this acoustic echo by using adaptive filtering to estimate the echo path and subtract the estimated echo path from the microphone signal.

In another implementation, it may be desirable to use a noise signal as reference signal 108. In particular, reference signal 108 may contain noise correlated in some way with noise contained in input signal 104. In this case, adaptive filter 110 identifies the appropriate filter coefficients for filtering input signal 104 such that filtered signal 112 would resemble reference signal 108. Then filtered signal 112 may be later subtracted from input signal 104 to increase the signal-to-noise ratio of the input signal.

Adaptive filter 110 includes a receiver 115 for receiving input signal 104 and reference signal 108 from signal sources 102 and 106. One or more portions of input signal 104 and/or reference signal 108 may be stored in memory 113 for processing. In particular, adaptive filter 110 includes a processor for updating the filter coefficients, and the updated filter coefficients may be based on previously received portions of input signal 104 and/or reference signal 108. Filtered signal 112 may be related to input signal 104 by $$y(n) = \sum_{l=0}^{L-1} \omega_l x(n-l),$$

where $\omega_l$ corresponds to the $l^{th}$ filter coefficient and L is a number of coefficients in the filter.

Furthermore, processor 111 may generate an error signal e(n) representative of a difference between reference signal 108 and filtered signal 112, or e(n)=d(n)−y(n). It is generally desirable to get the error signal as small as possible such that filtered signal 112 closely resembles reference signal 108. One way to decrease the magnitude of the error signal is to update the filter coefficients ω(n) adaptively.

The filter coefficients may be determined according to a particular mode of operation, selected by mode selector 119. In particular, mode selector 119 may select an appropriate mode of operation based on a correlation between input signal 104 and the error signal. Mode selector 119 may select one mode out of any number of modes. In particular, this disclosure describes two possible processes for mode selection: discrete mode selection and continuous mode selection. In discrete mode selection, one mode is selected out of a finite set of modes. An example function for discrete mode selection is described in more detail in relation to FIG. 4. In continuous mode selection, the selected mode is on a continuum between two or more modes. An example function for continuous mode selection is described in more detail in relation to FIG. 5. In either discrete mode selection or continuous mode selection, mode selector 119 may select a mode based on the correlation between input signal 104 and the error signal.

In particular, at an initial stage of the adaptive filtering process, the correlation between input signal 104 and the error signal might be high because filtered signal 112 likely does not resemble reference signal 108. In this case, the error signal would be highly correlated with input signal 104. Thus, at an initial stage of the adaptive filtering process, it is desirable for filtered signal 112 to quickly converge to an estimate of reference signal 108.

At a later stage of the adaptive filtering process, the steady state (or convergence) has been reached, such that filtered signal 112 has converged to reference signal 108. Thus, the correlation between input signal 104 and the error signal is low because the error signal has low amplitude, and input signal 104 and the error signal are nearly orthogonal.

Depending on whether the adaptive filtering process is in the initial stage or the later stage, the process may have different goals. In particular, it may be important during the initial stage for filtered signal 112 to quickly reach convergence or to reach the steady state. During the later stage, it may be more important to have an error signal that is very low in amplitude and to have a fast reversion time in case of an external perturbation that removes system 100 from the steady state. This fast reversion time may be referred to as a quick "wake up" time, and is important during the later stage so that system 100 may quickly return to the initial stage to quickly reach convergence. Adaptive filter 110 enables for both these goals to be achieved by using mode selector 119 to select an appropriate adaptive filtering mode of operation at different stages. Specifically, the mode may be chosen based on the correlation between input signal 104 and the error signal.

Correlator 116 may compute the correlation between input signal 104 (i.e., x(n)) and the error signal (i.e., e(n)) by using the equation $P_{xe}(n+1)=\beta'P_{xe}(n)+(1-\beta')x(n)e(n)$, where β' is a smoothing parameter. A high value of β' means that the correlation would not vary greatly from sample-to-sample, and a low value of β' allows for potentially greater sample-to-sample fluctuations in the correlation.

Figure 4:
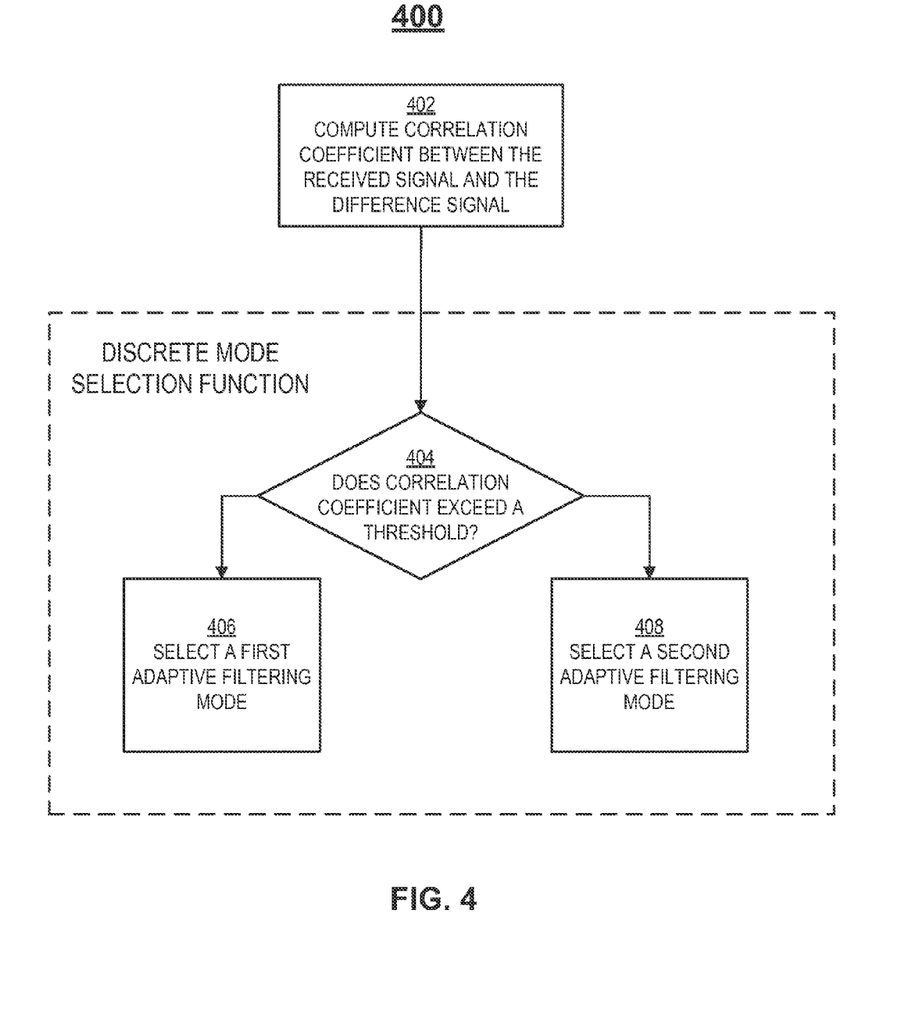
FIG. 4 shows a flow diagram of a method for selecting an adaptive filtering mode using discrete mode selection, in accordance with an embodiment of the disclosure.

In discrete mode selection, as is described in more detail in relation to FIG. 4, the comparator 118 compares an absolute value of the correlation $P_{xe}(n)$ to a threshold, and depending on a result of the comparison, the mode selector 119 may select one of two modes. In addition, continuous mode selection, which is described in more detail in relation to FIG. 5, involves selecting a mode on a continuum between two or more modes. Two possible modes of operation are described below, but one of ordinary skill in the art will understand that the adaptive filtering system 100 may use any number of modes. These two modes are briefly described below, but are described in more detail in relation to FIG. 4.

As an example, mode selector 119 may select a first mode of operation when the absolute value of $P_{xe}(n)$ exceeds the threshold. In the first mode, a large value for $\beta'$ may be selected (i.e., $\beta'=\beta_{max}$). As described above, a large value for $\beta'$ results in small sample-to-sample fluctuations in the correlation function. In the first mode, the filter coefficient at a particular sample may depend on a previous filter coefficient, a step size control parameter $\mu(n)$, and the error signal $e(n)$. As an example, the filter coefficient at sample n+1 may be defined by $\omega(n+1)=\omega(n)-\mu(n)\nabla e(n)$, where $\nabla$ denotes a gradient function. In the first mode, the step size control parameter $\mu(n)$ depends on the energy of the input signal 104. Specifically, $\mu(n)$ may be defined by $$\mu(n) = \frac{\mu}{\mu + P_x(n+1)}.$$

The energy evaluator 114 determines an amount of energy in the input signal 104 (i.e., $P_x(n)$) using an exponential averaging filter. The energy $P_x(n)$ in input signal 104 may be defined by $P_x(n+1)=\gamma P_x(n)+(1-\gamma)x^2(n)$, where $\gamma$ is a smoothing parameter.

As another example, the mode selector 119 may select a second mode of operation when the absolute value of $P_{xe}(n)$ is less than or equal to the threshold. In the second mode, a small value for $\beta'$ may be selected (i.e., $\beta'=\beta_{min}$). As described above, a small value for $\beta'$ results in potentially larger fluctuations in the correlation function. Having a small value for $\beta'$ allows for a quick reversion from the second mode to the first mode when there is an external perturbation. As in the first mode, in the second mode, the filter coefficient at a particular sample may depend on a previous filter coefficient, a step size control parameter $\mu(n)$, and the error signal $e(n)$. For example, the filter coefficient at sample n+1 may be defined by $\omega(n+1)=\omega(n)-\mu(n)\nabla e(n)$, where $\nabla$ denotes a gradient function. In the second mode, the step size control parameter $\mu(n)$ depends on the correlation between the input signal 104 and the error signal $e(n)$. Specifically, $\mu(n)$ may be defined by $\mu(n)=\alpha|P_{xe}(n+1)|$.

Figure 2:
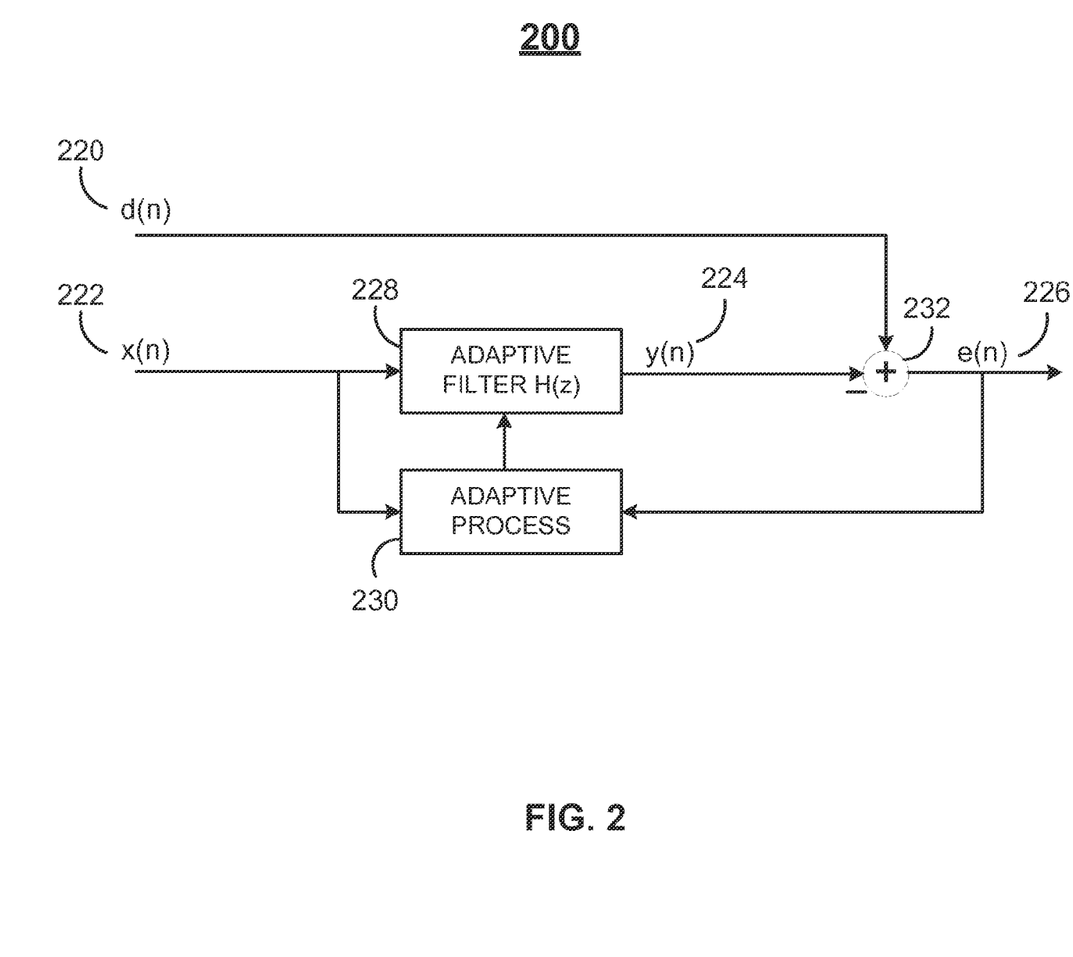
FIG. 2 shows an illustrative block diagram of an adaptive filtering system, in accordance with an embodiment of the disclosure.

FIG. 2 shows a simplified diagram of an illustrative composite adaptive filtering system 200, in accordance with an embodiment of the disclosure. System 200 includes an adaptive filter 228, an adaptive process 230, and an adder 232. In particular, an input signal 222 (i.e., $x(n)$) is provided as input to an adaptive filter 228 and an adaptive process 230. Adaptive filter 228 additionally receives input from adaptive process 230, which transmits instructions for how to update the filter coefficients of adaptive filter 228.

The output signal of adaptive filter 228 is an output signal 224 (i.e., $y(n)$), which is subtracted from a reference signal 220 (i.e., $d(n)$) at an adder 232 to generate an error signal 226 (i.e., $e(n)$). Error signal 226 is provided to adaptive process 230, which determines an appropriate adjustment to the filter coefficients of adaptive filter 228 based on error signal 226 and input signal 222.

In particular, as described in relation to FIG. 1, a filter coefficient at a particular sample may depend on a previous filter coefficient, a step size control parameter $\mu(n)$, and the error signal $e(n)$. Depending on a selected mode of operation, $\mu(n)$ may be defined based on the energy of input signal 222 and/or on a correlation between input signal 222 and error signal 226. In one implementation, $\mu(n)$ may be defined according to $$\mu(n) = \frac{\mu}{\mu + P_x(n+1)},$$

as in the first mode as described in relation to FIG. 1. In another implementation, $\mu(n)$ may be defined according to $\mu(n)=\alpha|P_{xe}(n+1)|$, as in the second mode as described in relation to FIG. 1. Adaptive process 230 may compute a step size control parameter $\mu(n)$ in accordance with one of the equations described herein, or in accordance with another equation. As described in relation to FIG. 4, in discrete mode selection, the value of $\mu(n)$ may be restricted to one of the two values described here. As described in relation to FIG. 5, in continuous mode selection, the value of $\mu(n)$ may be unrestricted, and the value of $\mu(n)$ may be any determined based on a linear combination of the two values described here. In general, $\mu(n)$ may be dependent on the energy of any signal or a correlation between any two signals, or a combination thereof.

In addition, depending on the selected mode of operation, $\beta'$ may also have different values. In particular, in the first mode as described in relation to FIG. 1, a large value for $\beta'$ may be selected (i.e., $\beta'=\beta_{max}$). A large value for $\beta'$ causes small sample-to-sample fluctuations in the correlation function. These small fluctuations will make it likely that system 100 remains in the first state and unlikely that the system will transition to another state. This is desirable to avoid an unnecessary number of transitions back and forth between the two states before the steady state is reached. Then, when steady state is reached, system 100 transitions to the second mode as described in relation to FIG. 1. In the second mode, a small value for $\beta'$ may be selected (i.e., $\beta'=\beta_{min}$). A small value for $\beta'$ causes large sample-to-sample fluctuations in the correlation function. These large fluctuations will make it likely that system 100 will return to the first state in the case of an external perturbation. This is desirable because if $x(n)$ and/or $d(n)$ have a sudden transient change or shift in value, it would be desirable to efficiently exit the second mode and return to the first mode so that convergence may again be quickly reached. Thus, having a small value for $\beta'$ results in a quick "wake-up" time for system 100 and is desirable for handling external perturbations to the system. As described in relation to FIG. 4, in discrete mode selection, the value of $\beta'$ may be restricted to either $\beta_{min}$ or $\beta_{max}$. As described in relation to FIG. 5, in continuous mode selection, the value of $\beta'$ may be unrestricted, and the value of $\beta'$ may be any determined based on a linear combination of $\beta_{min}$ and $\beta_{max}$.

Adaptive process 230 may use the step size control parameter $\mu(n)$ to determine how large of an adjustment is needed to a coefficient of the adaptive filter 228. As an example, the filter coefficient at sample n+1 may be defined by $\omega(n+1)=\omega(n)-\mu(n)\nabla e(n)$, where $\nabla$ denotes a gradient function. It is beneficial for an adaptive filtering process to update the filter coefficients based on a negative gradient because the negative gradient is useful for efficiently identifying a minimum in the residual error function. In one implementation, the adaptive process 230 computes and transmits $\mu(n)\nabla e(n)$ to the adaptive filter 228, which appropriately updates a next filter coefficient by subtracting the input from the adaptive process 230 from the previous filter coefficient.

Adaptive filter 228 and adaptive process 230 may be used in combination as adaptive filter 110 in FIG. 1. Using a single system with variable structure configured to operate in multiple modes is efficient in terms of both cost and space. The systems and methods described herein allow for a single system to operate in multiple modes to enable combining the advantages of the different modes while avoiding their limitations. In particular, one adaptive filtering mode may be selected for fast convergence, while another adaptive filtering mode may be selected to achieve low residual error. The systems and methods described herein provide ways for efficiently and effectively adjusting filter coefficients in an adaptive filter so that the output signal converges quickly and accurately to a reference signal.

Figure 3:
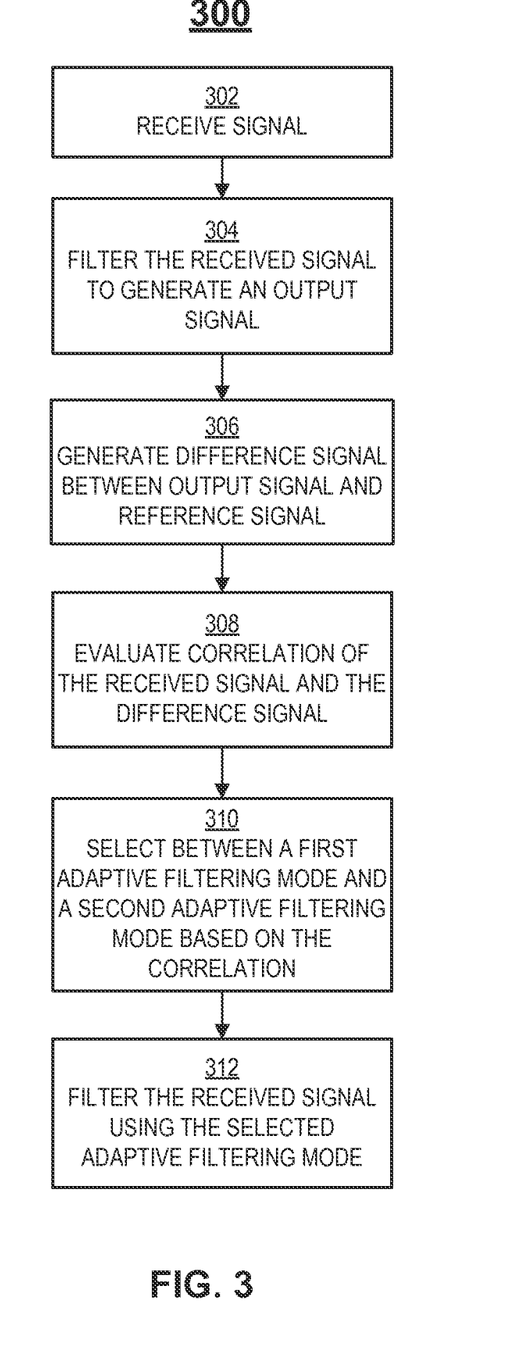
FIG. 3 shows a flow diagram of a method for adaptively filtering a signal, in accordance with an embodiment of the disclosure.

FIG. 3 shows a flow diagram of a method for adaptively filtering a signal, in accordance with an embodiment of the disclosure. Method 300 includes receiving a signal (302), filtering the received signal to generate an output signal (304), and generating a difference signal between the output signal and a reference signal (306). Method 300 further includes evaluating a correlation of the received signal and the difference signal (308), selecting between a first adaptive filtering mode and a second adaptive filtering mode based on the correlation (310), and filtering the received signal using the selected adaptive filtering mode.

At 302, a signal is received. As an example, adaptive filter 110 receives input signal 104 over receiver 115, as described in relation to FIG. 1.

At 304, the received signal is filtered to generate an output signal. Initially, there may be no output signal and therefore no error signal, so adaptive filter 110 may appropriately initialize its filter coefficients. As an example, the initial filter coefficients may be based on some prior information known about the input signal or the reference signal, or on any other information appropriate for initializing the filter.

At 306, adaptive filter 110 generates a difference signal between the output signal and a reference signal. As an example, the processor 111 evaluates a difference between the output signal and the reference signal 106 to generate an error signal: $e(n)=d(n)-y(n)$. It is generally desirable to get the error signal $e(n)$ as small as possible such that the filtered signal $y(n)$ closely resembles the reference signal $d(n)$. One way to decrease the magnitude of the error signal is to update the filter coefficients $\omega(n)$ adaptively.

At 308, correlator 116 evaluates a correlation of the received signal $x(n)$ and the difference signal $e(n)$. In particular, an unweighted correlation function $$P_{xe}(n) = \sum_{m=0}^{n-1} x(m)e(m)$$

may be used to compute a correlation coefficient between one or more portions of the received signal $x(n)$ and the difference signal $e(n)$. This function is "unweighted" because equal weights are applied to each sample in the input and error signals. However, in an adaptive filtering process, it may be desirable to apply different weights to different samples. In particular, it may be desirable to apply higher weights to more recent samples and to apply lower weights to older samples. The correlation function $P_{xe}(n+1)$ at a sample n+1 may be dependent on the value of the correlation function $P_{xe}(n)$ at the previous sample n. As an example, correlator 116 may compute $P_{xe}(n+1)$ in accordance with $P_{xe}(n+1)=\beta'P_{xe}(n)+(1-\beta')x(n)e(n)$, where $\beta'$ is a smoothing parameter. A high value of $\beta'$ would mean that the correlation would not vary greatly from sample to sample, and a low value of $\beta'$ would mean that the correlation function may have more sample-to-sample fluctuation.

At 310, mode selector 119 selects between a first adaptive filtering mode and a second adaptive filtering mode based on the correlation evaluated at 308. That is, depending on the value of correlation between the received signal $x(n)$ and the error signal $e(n)$, the first or second adaptive filtering modes, or a mode between the two adaptive filtering modes, is selected. In particular, mode selection can be discrete (in which one mode is selected from a finite number of modes) or continuous (in which a mode is selected that lies on a continuum between two or more modes). Discrete mode selection is described in more detail in relation to FIG. 4, and continuous mode selection is described in more detail in relation to FIG. 5. In either case, the mode selection is based at least in part on the correlation evaluated at 308.

Figure 5:
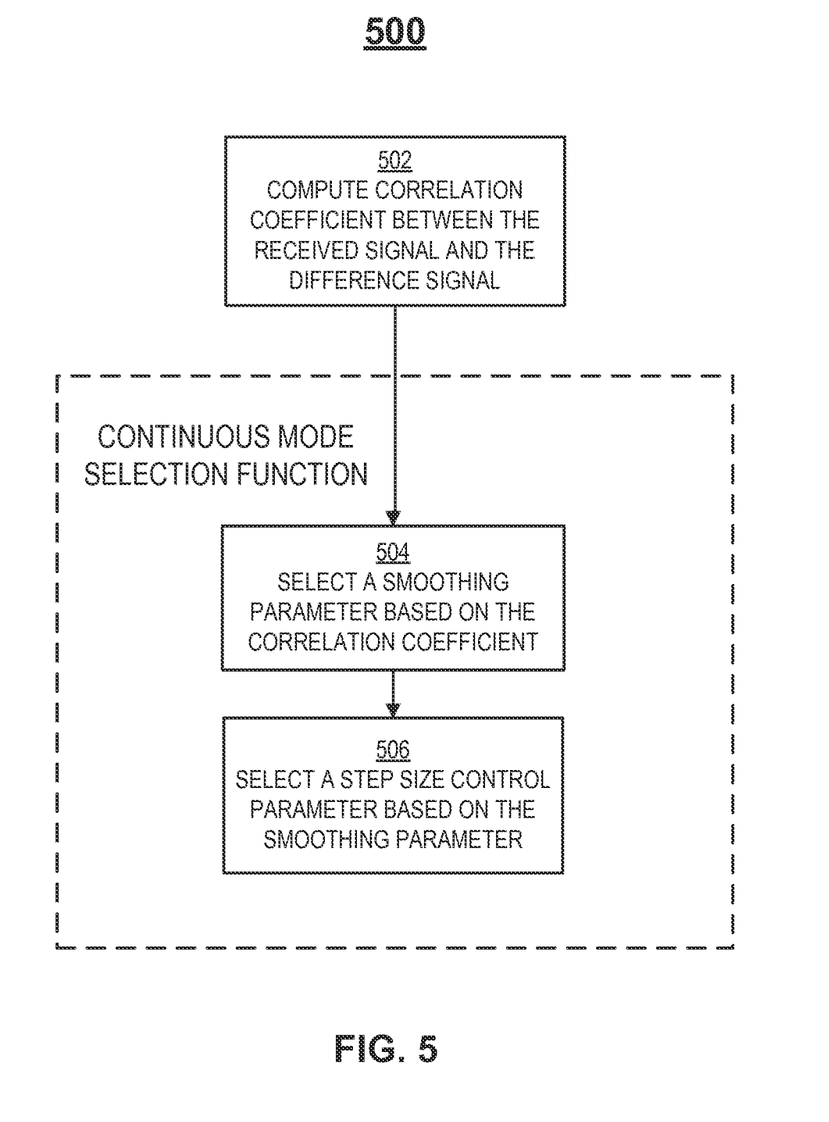
FIG. 5 shows a flow diagram of a method for selecting an adaptive filtering mode using continuous mode selection, in accordance with an embodiment of the disclosure.

After selecting an adaptive filtering mode, the filtering coefficients are evaluated, and at 312, adaptive filter 110 filters the input signal 104 according to the selected mode. In particular, the filtered signal 112 is related to the input signal 104 by $$y(n) = \sum_{l=0}^{L-1} \omega_l x(n-l),$$

where $\omega_l$ corresponds to the filter coefficient at the $l^{th}$ sample, and L is the length of the filter (or the number of filter coefficients). As an example, the filter coefficient at a particular sample may depend on a previous filter coefficient, a step size control parameter $\mu(n)$, and the error signal $e(n)$. For example, the filter coefficient at sample n+1 may be defined by $\omega(n+1)=\omega(n)-\mu(n)\nabla e(n)$, where the step size control parameter $\mu(n)$ dictates how much the filter coefficients change from sample to sample. How an appropriate value for $\mu(n)$ is evaluated is described in more detail in relation to FIGS. 4 and 5.

FIG. 4 shows a flow diagram of a method for discrete mode selection, in accordance with an embodiment of the disclosure. Method 400 includes computing a correlation coefficient between a received signal 222 and a difference signal 226 (402) and determining whether the correlation coefficient exceeds a threshold (404). If the correlation coefficient exceeds the threshold, a first adaptive filtering mode is selected (406), and otherwise, a second adaptive filtering mode is selected (408).

At 406, the first adaptive filtering mode is selected if the correlation coefficient exceeds the threshold. In one implementation, the correlation coefficient is high during an initial stage of the filtering process. In particular, the correlation is high because initially, the output signal $y(n)$ does not resemble the reference signal $d(n)$, so that the error signal $e(n)$ resembles the input signal $x(n)$. At an initial stage of the filtering process, it may be desirable to select a first adaptive filtering mode with a fast convergence time. Specifically, a fast convergence time would mean that the output signal $y(n)$ would converge to the reference signal $d(n)$ quickly.

In some implementations, the first adaptive filtering mode resembles a normalized least mean squares (LMS) approach. The normalized LMS approach to adaptive filtering has the advantages of a fast convergence time and stability. However, the normalized LMS adaptive filtering method has a disadvantage of having large excess residual mean squared error in the steady state (i.e., after convergence). Thus, it may be desirable to select the first adaptive filtering mode when fast convergence is needed during an initial stage of the adaptive filtering process, and then transition to a different adaptive filtering mode upon reaching the steady state.

In the first adaptive filtering mode, a smoothing parameter $\beta'$ is set to a high value (i.e., $\beta'=\beta_{max}$). The smoothing parameter describes how much the correlation between the input signal x(n) and the error signal e(n) varies from sample to sample (i.e., $P_{xe}(n+1)=\beta'P_{xe}(n)+(1-\beta')x(n)e(n)$). In particular, a large value for the smoothing parameter β' means that the correlation coefficient $P_{xe}$ will not vary much from sample to sample, so that it is likely that the first adaptive filtering mode will be selected at the next iteration. In some implementations, because the first adaptive filtering mode has a fast convergence time, this means that the output signal y(n) will converge quickly to the reference signal d(n) without adaptive filter 110 entering a different mode.

In addition, in the first mode, the step size control parameter μ(n) may depend on the energy of the input signal 104. Specifically, in some implementations, μ(n) is defined by $$\mu(n) = \frac{\mu}{\mu + P_x(n)}.$$

In some implementations, μ on the right hand side of the equation is a constant that is heuristically determined based on experimental results to get stability in the adaptive filtering algorithm. The dependence of μ(n) on the energy of the input signal 104 may be to ensure stability in system 100. Energy evaluator 114 determines an amount of energy in input signal 104 (i.e., $P_x(n)$) using an exponential averaging filter. Specifically, $P_x(n)$ may be defined by $P_x(n+1)=\gamma P_x(n)+(1-\gamma)x^2(n)$, where γ is a smoothing parameter.

At 408, the second adaptive filtering mode is selected if the correlation coefficient is below or equal to the threshold. In one implementation, the correlation coefficient is low during a later stage of the filtering process. In particular, at a later stage, convergence may have been reached, and the error signal e(n) is close to zero, such that the correlation coefficient is low. At this later stage of the filtering process, it may be desirable to select a second adaptive filtering mode with a low residual error. Specifically, a low residual error would mean that the output signal y(n) would closely resemble the reference signal d(n) in the steady state. In adaptive filtering processes, it is typically desirable to have low residual error between the output signal y(n) and the reference signal d(n). Thus, the second adaptive filtering mode may be selected for the mode's low residual error. However, selection of the second adaptive filtering mode may not be appropriate for an initial stage of the adaptive filtering process because the second mode has a slower convergence time compared to the first mode.

In some implementations, the second adaptive filtering mode resembles a correlation LMS approach. Compared to the normalized LMS approach, the correlation LMS approach to adaptive filtering has the advantage of a low residual error in the steady state. However, a disadvantage of the correlation LMS adaptive filtering method is slow convergence time compared to a normalized LMS approach. Thus, it may be desirable to select the first adaptive filtering mode (i.e., resembling a normalized LMS approach) when fast convergence is needed during an initial stage of the adaptive filtering process. Then, it may be desirable to transition to the second adaptive filtering mode (i.e., resembling a correlation LMS approach) upon reaching the steady state to take advantage of the low residual error.

In the second adaptive filtering mode, a smoothing parameter β' is set to a low value (i.e., $\beta'=\beta_{min}$). The smoothing parameter describes how much the correlation between the input signal x(n) and the error signal e(n) varies from sample to sample (i.e., $P_{xe}(n+1)=\beta'P_{xe}(n)+(1-\beta')x(n)e(n)$). In particular, a small value for the smoothing parameter β' means that the correlation coefficient $P_{xe}$ may vary from sample to sample, so that it is possible for the adaptive filter 110 to transition back to the first adaptive filtering mode when the correlation $P_{xe}$ is high. As an example, the reference signal d(n) may exhibit a sudden change or shift. In this case, it may be desirable for the output signal y(n) to track the sudden change in the reference signal d(n). However, remaining in the second mode is undesirable because an adaptive filter operating in the second mode converges slowly. Thus, it may be desirable to be able to switch quickly to the first mode in order to take advantage of the first mode's fast convergence time. Therefore, selecting a low value for the smoothing parameter β' in the second mode allows for quick reversion to the first adaptive filtering mode when necessary.

In addition, in the second mode, the step size control parameter μ(n) may depend on the correlation of the input signal x(n) and the error signal e(n). Specifically, in some implementations, μ(n) is defined by $\mu(n)=\alpha|P_{xe}(n+1)|$. In some implementations, μ(n) is smaller in the second mode than in the first mode. In particular, a larger step size creates large fluctuations in the error signal and enables a fast convergence. After convergence is reached, in the second adaptive filtering mode, it is desirable to keep the residual error as small as possible while enabling a quick "wake-up" time in case of an external perturbation. Using a smaller step size in the second mode is desirable to keep the error signal e(n) near zero.

Method 400 depicts a discrete mode selection process for selecting between two adaptive filtering modes. However, one of ordinary skill in the art will understand that the systems and methods described herein are applicable to an adaptive filtering system using any number of modes. Based on a value of any parameter such as a correlation between the input signal and the error signal, any one of these modes may be selected.

FIG. 5 shows a flow diagram of a method for continuous mode selection, in accordance with an embodiment of the disclosure. Method 500 includes computing a correlation coefficient between a received signal 222 and a difference signal 226 (502), selecting a smoothing parameter based on the correlation coefficient (504), and selecting a step size control parameter based on the smoothing parameter (506).

Unlike the discrete mode selection function described in relation to FIG. 4, continuous mode selection does not involve selecting a mode from a finite number of modes. Rather, continuous mode selection involves selecting parameter values that fall on a continuum between two or more adaptive filtering modes. For example, as is described below in more detail, continuous mode selection allows for selection of a mode that essentially falls between the first and second modes described in relation to FIG. 4. In particular, as is described below, a parameter β' is used to represent a position on a continuum between two modes. However, one of ordinary skill in the art will understand that the systems and methods described herein are applicable to selection of a mode that falls between any number of modes.

At 504, a smoothing parameter β' is selected based on the correlation coefficient. In discrete mode selection as described in relation to FIG. 4, for each iteration, β' is restricted to be equal to either $\beta_{min}$ or $\beta_{max}$. However, in continuous mode selection, β' no longer has this restriction and is allowed to vary between $\beta_{min}$ and $\beta_{max}$. Thus, rather than setting β' equal to one of two values when discrete mode selection is used (i.e., $\beta_{max}$ during an initial stage of the adaptive filtering process before convergence, and $\beta_{min}$ during a later stage of the process in the steady state), $\beta'$ may transition smoothly from $\beta_{max}$ to $\beta_{min}$ when continuous mode selection is used.

In one implementation, $\beta'=\tau\beta_{max}+(1-\tau)\beta_{min}$, where $$\tau = \min\left(1, \frac{|P_{xe}(n)|}{h}\right).$$

In particular, h may be restricted to be positive such that $\tau$ varies between 0 and 1 and $\beta'$ varies between $\beta_{max}$ and $\beta_{min}$. When the input signal x(n) and the error signal e(n) are similar (i.e., during an initial stage of the adaptive filtering process), the correlation $P_{xe}(n)$ between the two signals $P_{xe}(n)$ is high. In this case, $\tau$ likely equals or is close to one, such that $\beta' \approx \beta_{max}$, and the filtering process is similar to operation under the first adaptive filtering mode described in relation to FIG. 4. Alternatively, when the error signal e(n) is small (i.e., during a later stage of the adaptive filtering process), the correlation between the two signals $P_{xe}(n)$ is low. In this case, $\tau$ is close to zero, such that $\beta' \approx \beta_{min}$, and the filtering process is similar to operation under the second adaptive filtering mode described in relation to FIG. 4. However, by not limiting the smoothing parameter $\beta'$ to take on one of two values, continuous mode selection allows for $\beta'$ to transition smoothly from $\beta_{max}$ to $\beta_{min}$.

At 506, a step size control parameter $\mu$ is selected based on the selected smoothing parameter $\beta'$. In one implementation, just as $\beta'$ may take on any value between $\beta_{max}$ and $\beta_{min}$, inclusive, the step size control parameter $\mu$ may similarly take on any value between two values, where the relative weights of the two values are determined by the smoothing parameter $\beta'$ selected at 504. In one implementation, the two values are determined by the values of $\mu$ in the first and second adaptive filtering modes described in relation to FIG. 3. In particular, $$\mu_1(n) = \frac{\mu}{\mu + P_x(n+1)}$$

and $\mu_2(n)=\alpha|P_{xe}(n+1)|$. Then, the value of the step size control parameter $\mu$ for continuous mode selection is selected based on the value of the smoothing parameter $\beta'$, which is used as a relative weight between these two values. Specifically, $\mu(n)=\beta\mu_1+(1-\beta)\mu_2$.

At an initial stage of the adaptive filtering process, $\beta'$ is near $\beta_{max}$, such that $\mu$ is near $\mu_1$, which is a relatively larger step size than $\mu_2$ and allows for faster convergence as in the first adaptive filtering mode. At a later stage of the adaptive filtering process, $\beta'$ is near $\beta_{min}$, such that $\mu$ is near $\mu_2$, which is small because the error signal e(n) is near zero and the correlation between the input signal x(n) and the error signal e(n) is small.

The continuous mode selection described in relation to FIG. 5 involves selecting parameter values that fall on a continuum between the first and second adaptive filtering modes described in relation to FIG. 4. In particular, the smoothing parameter $\beta'$ is used to represent a position on a continuum between the two modes. Thus, rather than restricting the filtering parameters $\beta'$ and $\mu$ to each take on one of two possible values, continuous mode selection allows for the filtering parameters to smoothly transition between values.

In some implementations, it may be advantageous to use discrete mode selection. In particular, discrete mode selection is easy to implement, and because it uses fewer equations than continuous mode selection, discrete mode selection is cheaper to implement. However, one disadvantage of discrete mode selection is that only a finite number of states are possible. In one implementation described herein, only two states are possible, such that convergence will occur in only one of two states. Essentially, the composite adaptive filtering process described herein may be thought of as a two-dimensional optimization problem with an objective to minimize two parameters—the time to convergence and the error in the steady state. By limiting the number of possible states, discrete mode selection limits the ability of an adaptive filtering system to find the optimal point on the two-dimensional plane. In contrast, continuous mode selection allows for the solution to the two-dimensional optimization problem to be anywhere on the two-dimensional plane by allowing the system parameters to vary continuously. Thus, using continuous mode selection may provide a faster convergence and/or a lower steady state error than discrete mode selection. However, using continuous mode selection may be disadvantageous because it uses more equations than discrete mode selection and may be more expensive to implement.

Figure 6:
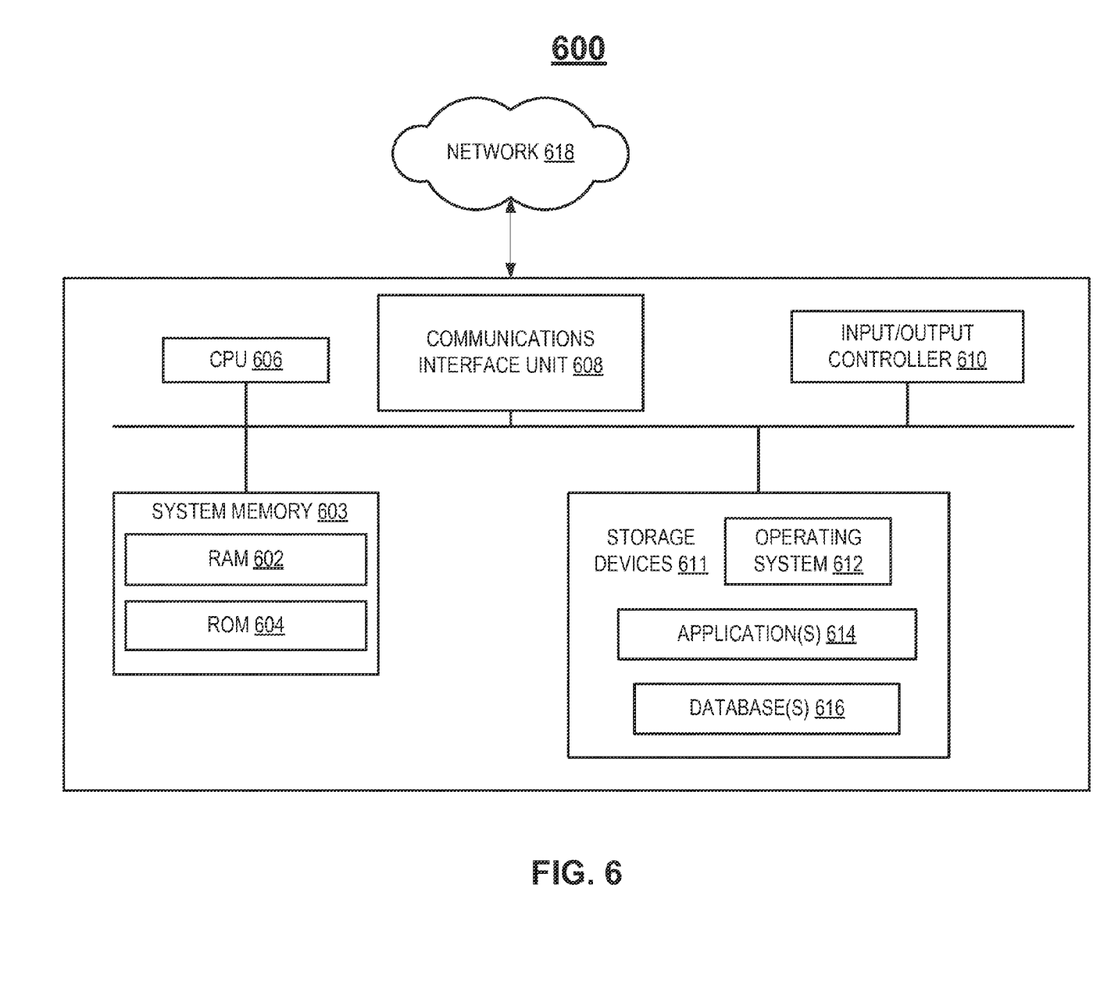
FIG. 6 is a block diagram of a computing device, such as any of the components of the systems of FIGS. 1 and 2, for performing any of the processes described herein, in accordance with an embodiment of the disclosure.

FIG. 6 is a block diagram of a computing device, such as any of the components of the systems of FIG. 1 or 2, for performing any of the processes described herein, in accordance with an embodiment of the disclosure. Each of the components of these systems may be implemented on one or more computing devices 600. In certain aspects, a plurality of the components of these systems may be included within one computing device 600. In certain implementations, a component and a storage device 611 may be implemented across several computing devices 600.

The computing device 600 comprises at least one communications interface unit 608, an input/output controller 610, system memory 603, and one or more data storage devices 611. The system memory 603 includes at least one random access memory (RAM 602) and at least one read-only memory (ROM 604). All of these elements are in communication with a central processing unit (CPU 606) to facilitate the operation of the computing device 600. The computing device 600 may be configured in many different ways. For example, the computing device 600 may be a conventional standalone computer or alternatively, the functions of computing device 600 may be distributed across multiple computer systems and architectures. In FIG. 6, the computing device 600 is linked, via network 618 or local network, to other servers or systems.

The computing device 600 may be configured in a distributed architecture, wherein databases and processors are housed in separate units or locations. Some units perform primary processing functions and contain at a minimum a general controller or a processor and a system memory 603. In distributed architecture implementations, each of these units may be attached via the communications interface unit 608 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 606 comprises a processor, such as one or more conventional microprocessors and one or more supplementary co-processors such as math co-processors for offloading workload from the CPU 606. The CPU 606 is in communication with the communications interface unit 608 and the input/output controller 610, through which the CPU 606 communicates with other devices such as other servers, user terminals, or devices. The communications interface unit 608 and the input/output controller 610 may include multiple communication channels for simultaneous communication with, for example, other processors, servers or client terminals.

The CPU 606 is also in communication with the data storage device 611. The data storage device 611 may comprise an appropriate combination of magnetic, optical or semiconductor memory, and may include, for example, RAM 602, ROM 604, flash drive, an optical disc such as a compact disc or a hard disk or drive. The CPU 606 and the data storage device 611 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 606 may be connected to the data storage device 611 via the communications interface unit 608. The CPU 606 may be configured to perform one or more particular processing functions.

The data storage device 611 may store, for example, (i) an operating system 612 for the computing device 600; (ii) one or more applications 614 (e.g., computer program code or a computer program product) adapted to direct the CPU 606 in accordance with the systems and methods described here, and particularly in accordance with the processes described in detail with regard to the CPU 606; or (iii) database(s) 616 adapted to store information that may be utilized to store information required by the program.

The operating system 612 and applications 614 may be stored, for example, in a compressed, an uncompiled and an encrypted format, and may include computer program code. The instructions of the program may be read into a main memory of the processor from a computer-readable medium other than the data storage device 611, such as from the ROM 604 or from the RAM 602. While execution of sequences of instructions in the program causes the CPU 606 to perform the process steps described herein, hard-wired circuitry may be used in place of, or in combination with, software instructions for implementation of the processes of the present disclosure. Thus, the systems and methods described are not limited to any specific combination of hardware and software.

Suitable computer program code may be provided for performing one or more functions in relation to adaptive filtering as described herein. The program also may include program elements such as an operating system 612, a database management system and "device drivers" that allow the processor to interface with computer peripheral devices (e.g., a video display, a keyboard, a computer mouse, etc.) via the input/output controller 610.

The term "computer-readable medium" as used herein refers to any non-transitory medium that provides or participates in providing instructions to the processor of the computing device 600 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer can read.

Various forms of computer readable media may be involved in carrying one or more sequences of one or more instructions to the CPU 606 (or any other processor of a device described herein) for execution. For example, the instructions may initially be borne on a magnetic disk of a remote computer (not shown). The remote computer can load the instructions into its dynamic memory and send the instructions over an Ethernet connection, cable line, or even telephone line using a modem. A communications device local to a computing device 600 (e.g., a server) can receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for adaptively filtering a signal, comprising:
receiving a signal;
filtering the received signal to generate an output signal;
generating a difference signal based on a difference between the output signal and a reference signal;
evaluating, using a smoothing parameter, a correlation of the received signal and the difference signal;
selecting, based at least in part on the correlation, between a first adaptive filtering mode having a first value for the smoothing parameter and a second adaptive filtering mode having a second value for the smoothing parameter that is different from the first value, wherein the second value for the smoothing parameter is smaller than the first value for the smoothing parameter, such that the first adaptive filtering mode is selected when there is a transient change in the received signal or in the reference signal; and
filtering the received signal using the selected adaptive filtering mode.

2. The method of claim 1, wherein evaluating the correlation comprises computing a correlation coefficient between a portion of the received signal and a portion of the difference signal.

3. The method of claim 2, wherein the first adaptive filtering mode is selected when the correlation coefficient exceeds a threshold, and the second adaptive filtering mode is selected when the correlation coefficient is less than or equal to the threshold.

4. The method of claim 3, wherein the threshold is based on an absolute value of the difference signal in steady state.

5. The method of claim 1, wherein the first adaptive filtering mode yields a first convergence rate, and the second adaptive filtering mode yields a second convergence rate slower than the first convergence rate.

6. The method of claim 1, wherein the first adaptive filtering mode yields a first residual error in a steady state, and the second adaptive filtering mode yields a second residual error in the steady state lower than the first residual error.

7. The method of claim 1, wherein the selecting comprises selecting an adaptive filtering mode on a continuum between the first adaptive filtering mode and the second adaptive filtering mode.

8. The method of claim 7, wherein selecting the adaptive filtering mode on the continuum allows for convergence to an optimal point on a two-dimensional plane.

9. The method of claim 1, wherein the first adaptive filtering mode is a normalized least mean squares operation, and the second adaptive filtering mode is a correlation least mean squares operation.

10. A system for adaptively filtering a signal, comprising:
a receiver configured to receive a signal;
a circuitry configured to:
filter the received signal to generate an output signal;
generate a difference signal based on a difference between the output signal and a reference signal;
evaluate, using a smoothing parameter, a correlation of the received signal and the difference signal;
select, based at least in part on the correlation, between a first adaptive filtering mode having a first value for the smoothing parameter and a second adaptive filtering mode having a second value for the smoothing parameter that is different from the first value for the smoothing parameter, wherein the second value for the smoothing parameter is smaller than the first value for the smoothing parameter, such that the first adaptive filtering mode is selected when there is a transient change in the received signal or in the reference signal; and
filter the received signal using the selected adaptive filtering mode.

11. The system of claim 10, wherein the circuitry evaluates the correlation by computing a correlation coefficient between a portion of the output signal and a portion of the difference signal.

12. The system of claim 11, wherein the circuitry selects the first adaptive filtering mode when the correlation coefficient exceeds a threshold, and the circuitry selects the second adaptive filtering mode when the correlation coefficient is less than or equal to the threshold.

13. The system of claim 12, wherein the threshold is based on an absolute value of the difference signal in steady state.

14. The system of claim 10, wherein the first adaptive filtering mode yields a first convergence rate, and the second adaptive filtering mode yields a second convergence rate slower than the first convergence rate.

15. The system of claim 10, wherein the first adaptive filtering mode yields a first residual error in a steady state, and the second adaptive filtering mode yields a second residual error in the steady state lower than the first residual error.

16. The system of claim 10, wherein the circuitry selects an adaptive filtering mode on a continuum between the first adaptive filtering mode and the second adaptive filtering mode.

17. The system of claim 16, wherein the circuitry selects the adaptive filtering mode on the continuum to reach convergence at an optimal point on a two-dimensional plane.

18. The system of claim 10, wherein the first adaptive filtering mode is a normalized least mean squares operation, and the second adaptive filtering mode is a correlation least mean squares operation.

* * * * *